(12) United States Patent
Aoyagi

(10) Patent No.: US 6,233,494 B1
(45) Date of Patent: May 15, 2001

(54) METHOD OF MEASURING OVERLAY OFFSET

(75) Inventor: Nobuaki Aoyagi, Yamagata (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 08/916,337

(22) Filed: Aug. 22, 1997

(30) Foreign Application Priority Data

Aug. 23, 1996 (JP) .................................................. 8-222346

(51) Int. Cl.$^7$ .................................................. G06F 19/00

(52) U.S. Cl. ............................................. 700/121; 716/21

(58) Field of Search ................... 364/468.28; 395/500.2, 395/500.21, 500.22; 700/121; 716/19, 20, 21; 250/491.1, 492.2, 492.21, 492.22; 356/375, 401; 430/270.1, 290, 311, 394

(56) References Cited

U.S. PATENT DOCUMENTS

| | | | | |
|---|---|---|---|---|
| 5,015,866 | * | 5/1991 | Hayashi .............................. | 250/548 |
| 5,117,255 | * | 5/1992 | Shiraishi et al. ...................... | 355/53 |
| 5,298,761 | * | 3/1994 | Aoki et al. ........................... | 250/548 |
| 5,300,786 | * | 4/1994 | Brunner et al. ...................... | 250/548 |
| 5,521,036 | * | 5/1996 | Iwamoto et al. ...................... | 430/22 |
| 5,585,925 | * | 12/1996 | Sato et al. ........................... | 356/401 |
| 5,602,492 | * | 2/1997 | Cresswell et al. ................... | 324/763 |
| 5,712,707 | * | 1/1998 | Ausschnitt et al. .................. | 356/401 |
| 5,783,342 | * | 7/1998 | Yamashita et al. ................... | 430/30 |

* cited by examiner

Primary Examiner—Paul P. Gordon
(74) Attorney, Agent, or Firm—Foley & Lardner

(57) ABSTRACT

A method of measuring the overlay offset of a resist pattern formed on a semiconductor wafer is disclosed. An aligner outputs wafer-by-wafer measured alignment data. A scattering of the wafer-by-wafer alignment data is calculated. If the scattering is greater than a preselected value, all the wafers of a lot brought to a measuring step are tested. If the scattering is smaller than the preselected value, only sample wafers are tested. Whether or not sampling should be effected is automatically determined.

7 Claims, 13 Drawing Sheets

| Fig. 1A |
| Fig. 1B |

ALIGNMENT SENSOR MEASURES SEVERAL POINTS OF ALIGNMENT MARKS WAFER BY WAFER. WAFER-BY-WAFER MEASURED VALUES ARE STATISTICALLY PROCESSED TO CALCULATE DRIVE POSITION OF WAFER STAGE. EACH WAFER IS EXPOSED BASED ON CALCULATED DATA UNDER EXPOSURE POSITION CONTROL. ~S1

DEVELOPMENT ~S2

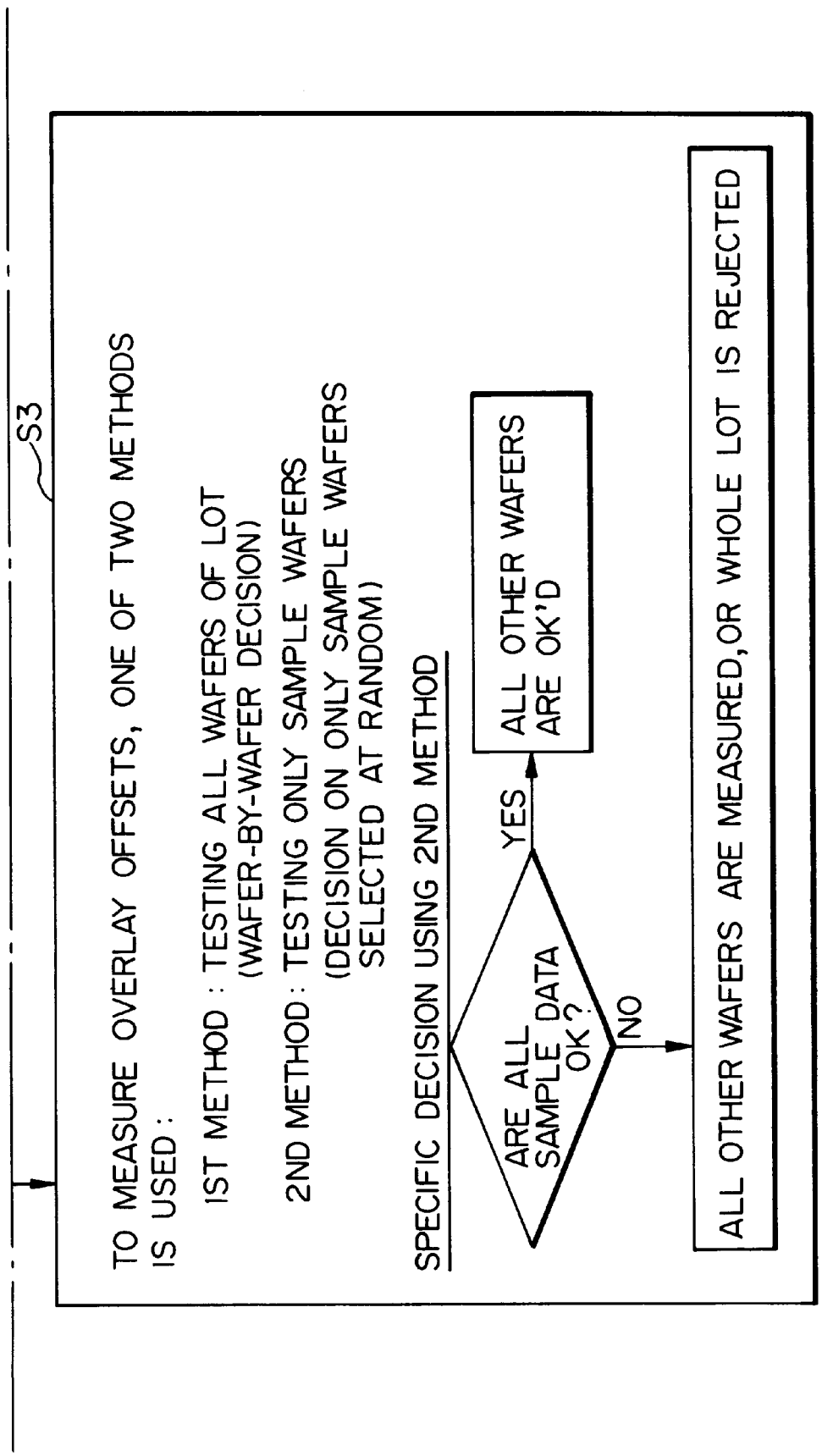

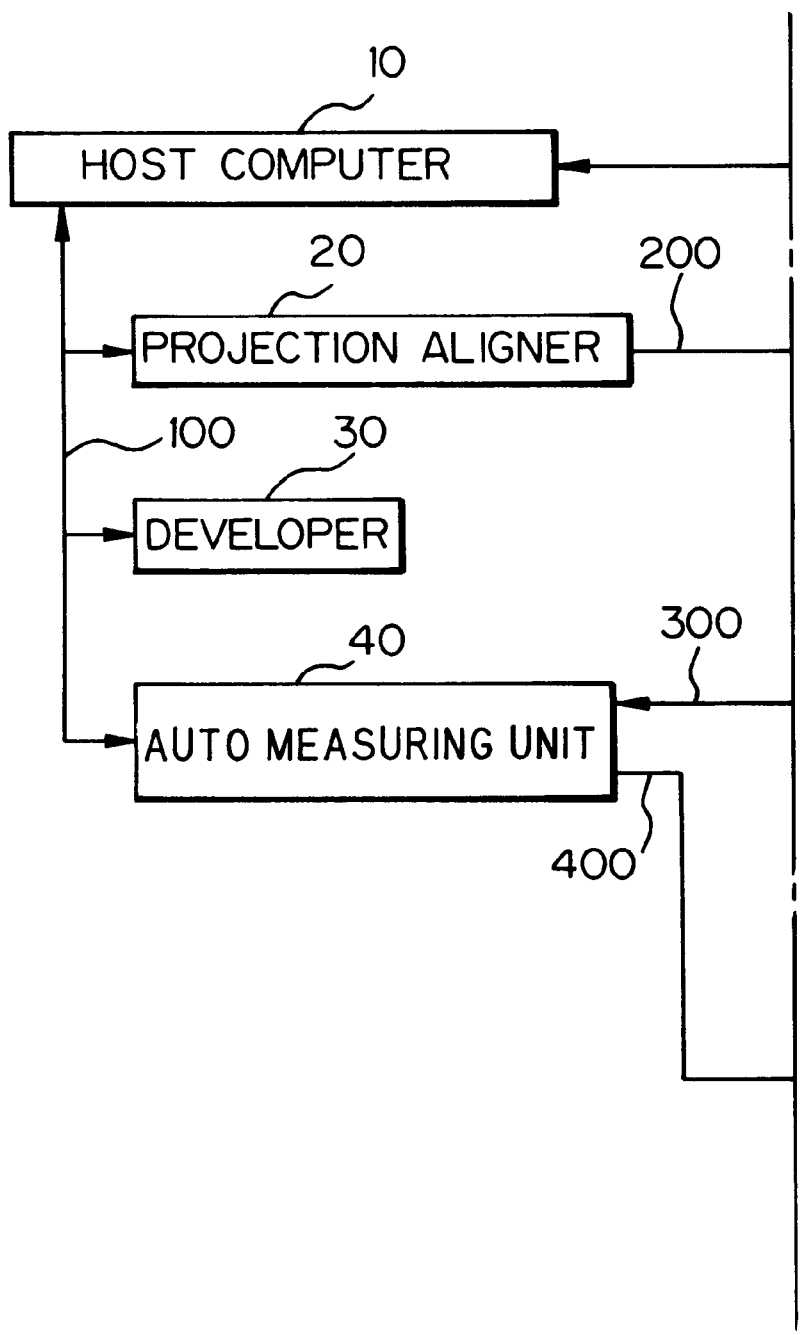

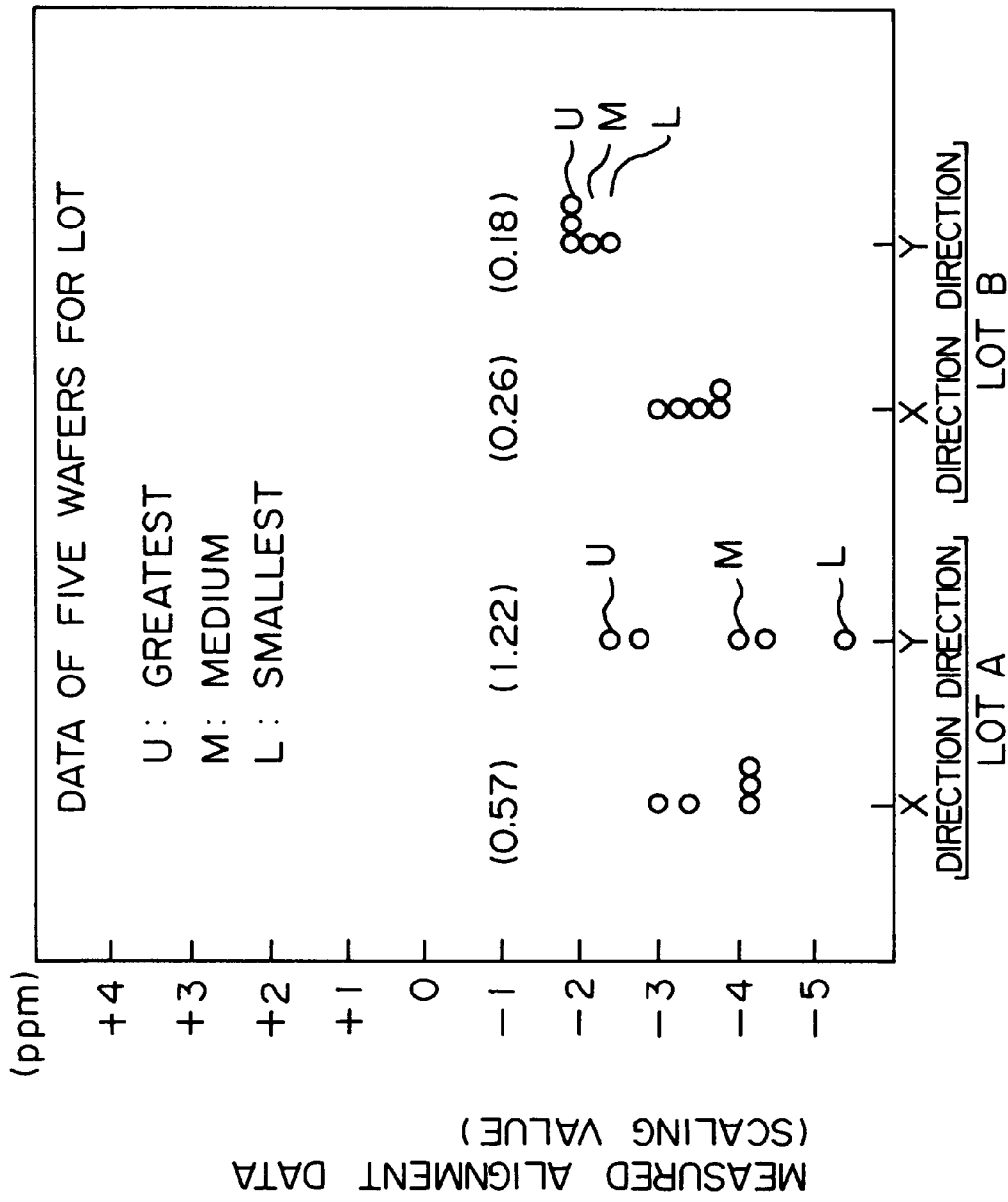

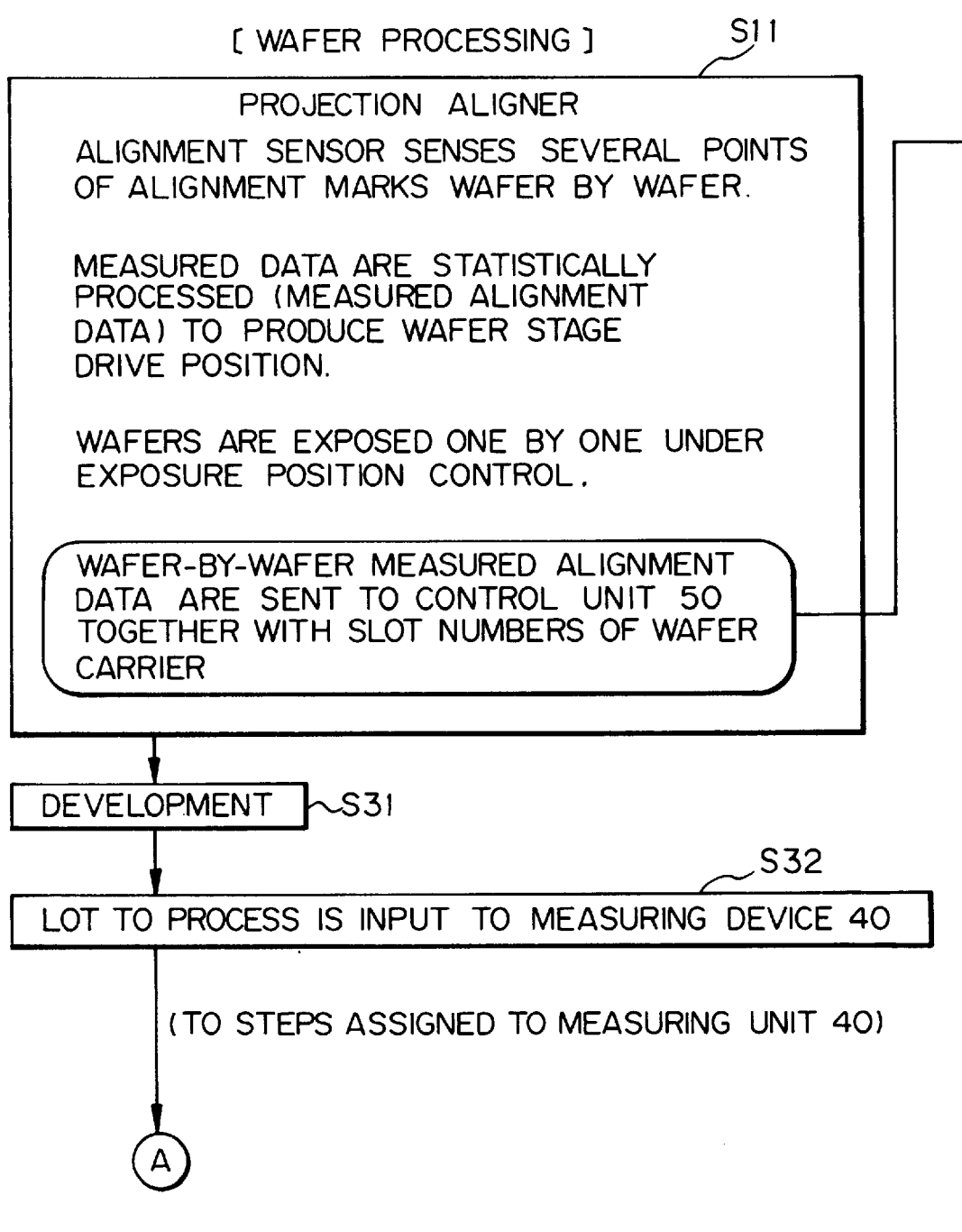

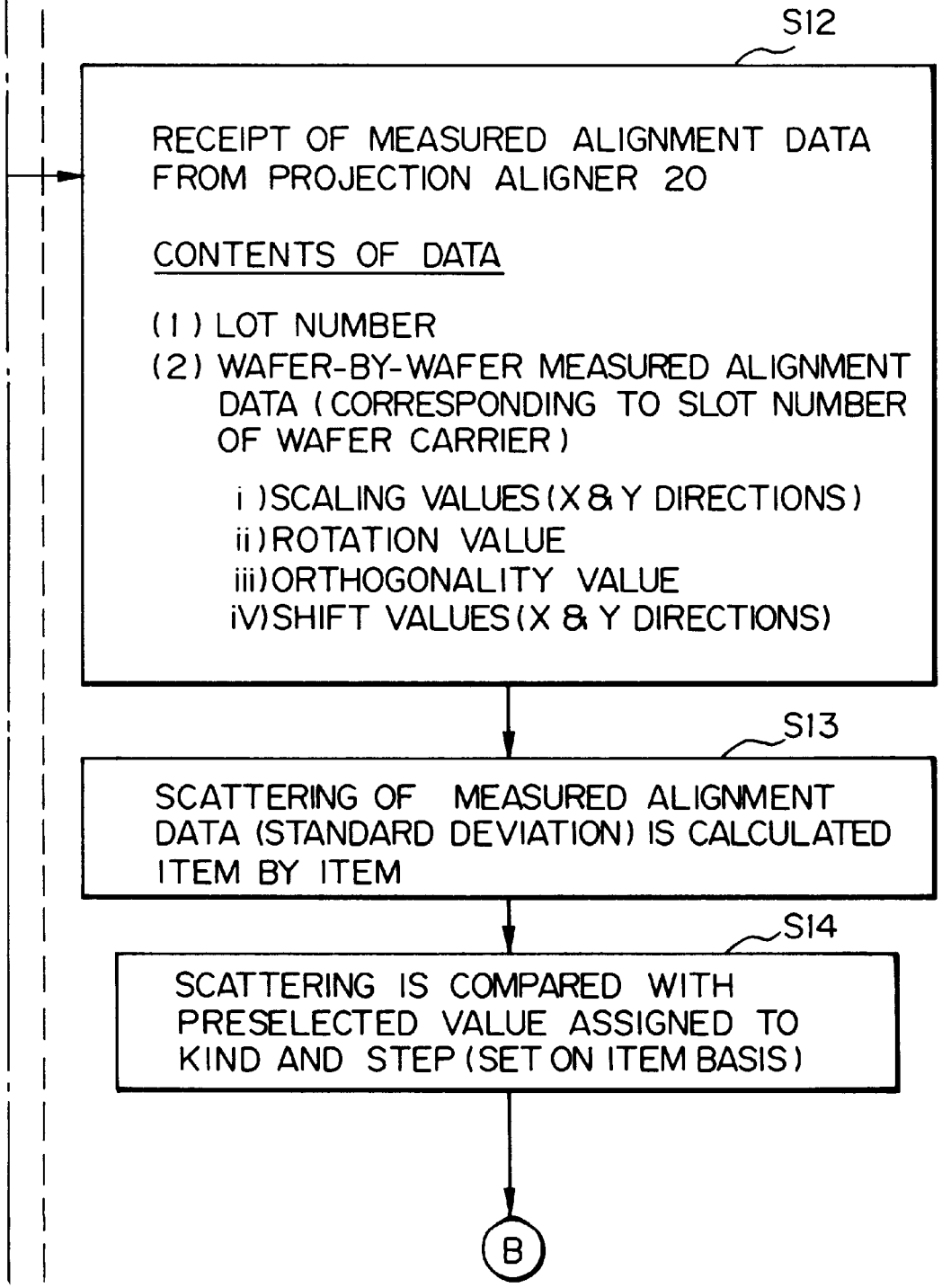

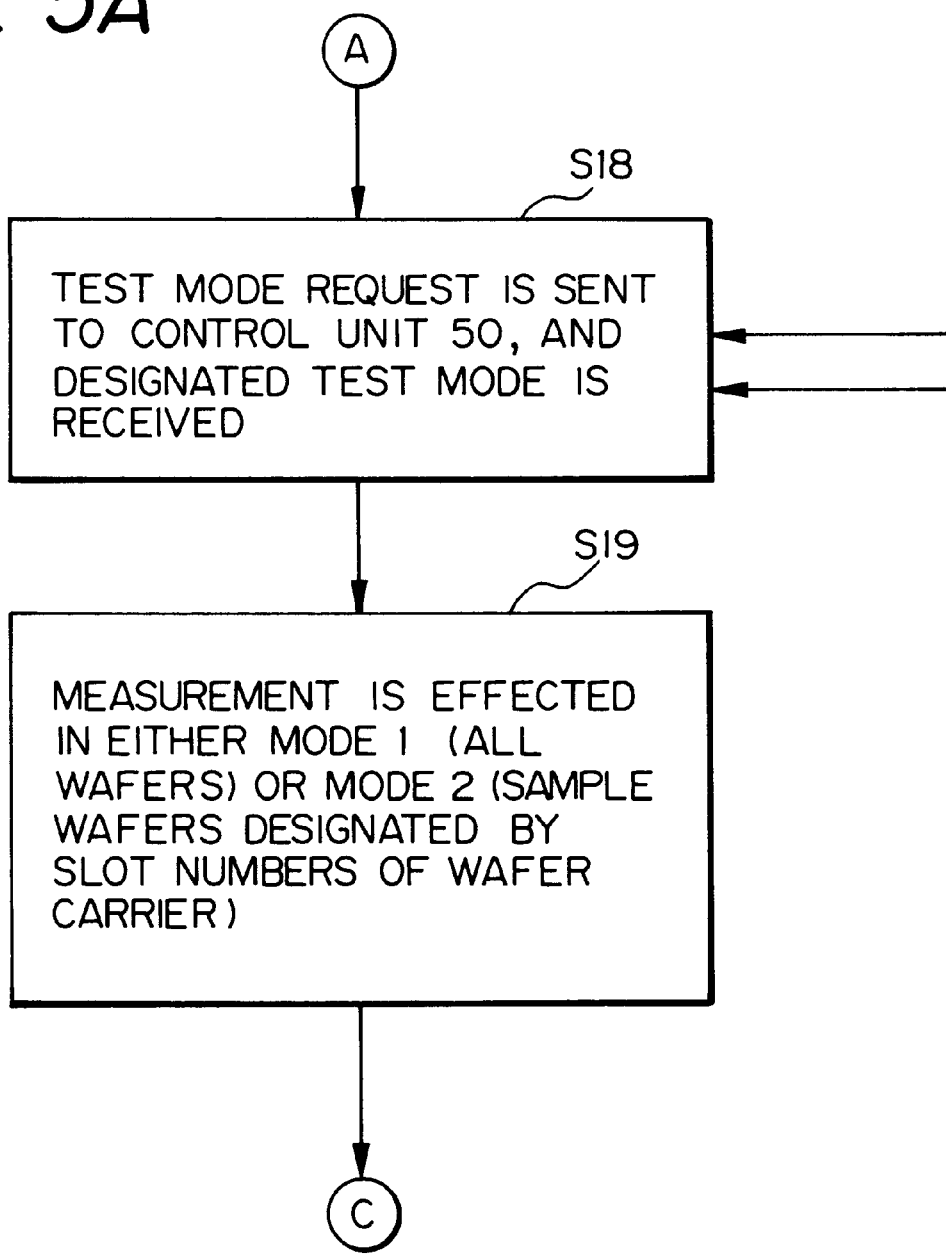

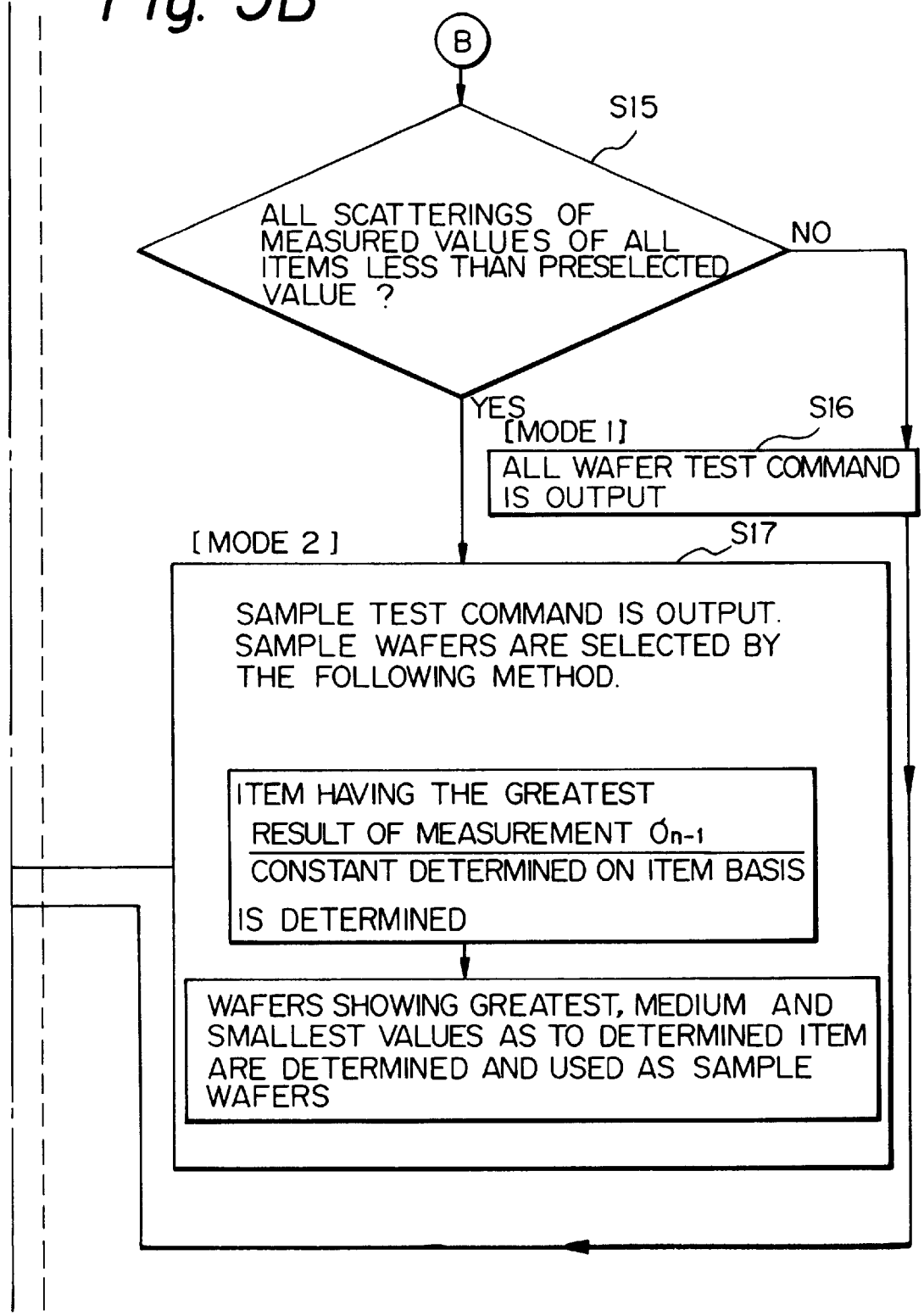

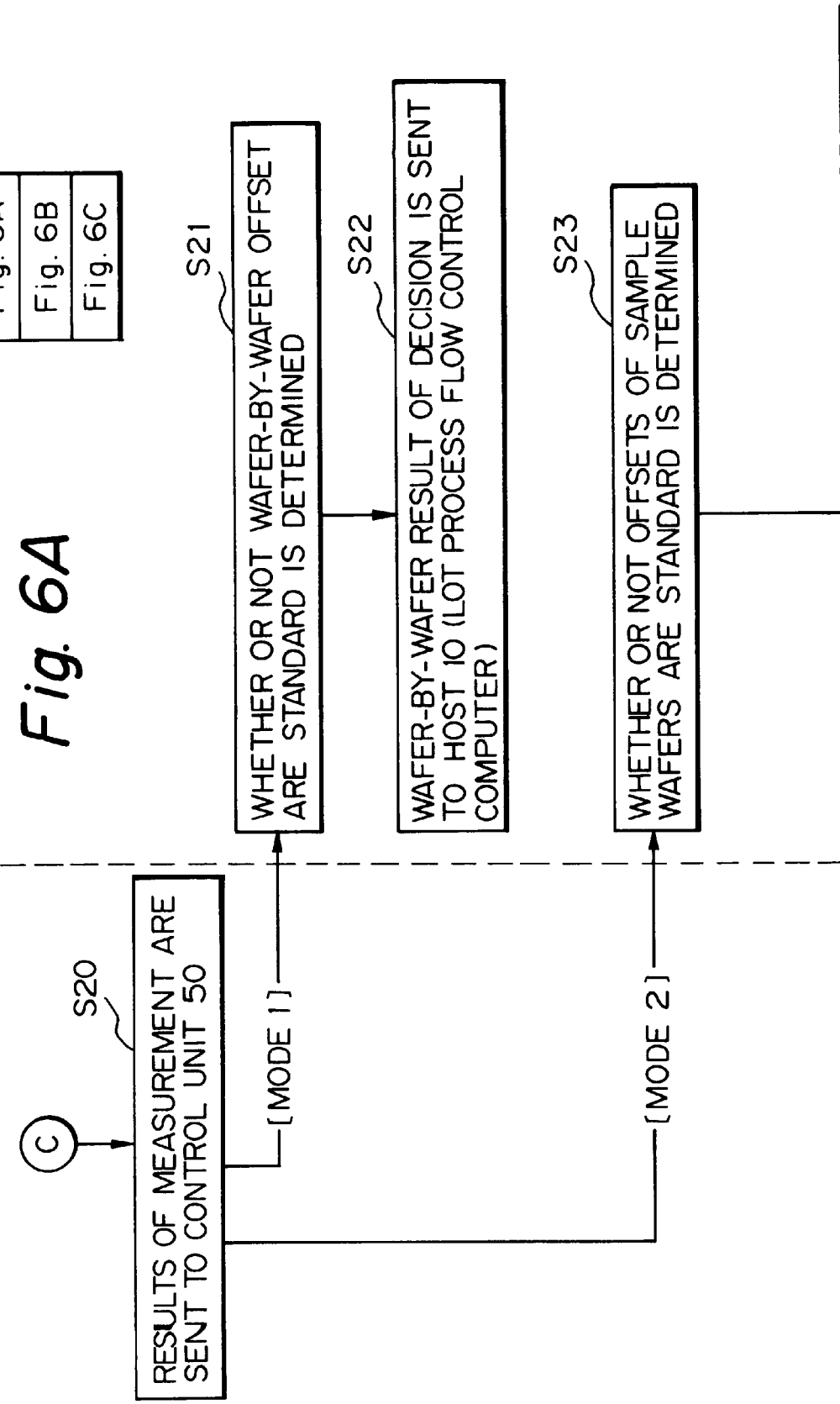

METHOD OF MEASURING OVERLAY OFFSET

BACKGROUND OF THE INVENTION

The present invention relates to a method of measuring an overlay offset and, more particularly, to a method of measuring the overlay offset of a resist pattern formed on a semiconductor wafer in, e.g., a lithography step for the production of a semiconductor device.

It is a common practice with the production of a semiconductor device to measure the overlay offset of a resist pattern from a pattern existing on a semiconductor wafer. Specifically, when a wafer covered with photoresist is exposed to a desired mask pattern by a demagnification projection aligner, it is necessary to expose a preselected part of the existing pattern to the mask pattern with accuracy. Therefore, the position of the pattern existing on the wafer must be measured first.

To measure the position of the pattern existing on the wafer, an alignment sensor is mounted on the projection aligner in order to sense alignment marks provided on the wafer beforehand. Specifically, several sample marks or points of the surface of the wafer are measured, and then the resulting coordinates data are statistically processed in order to produce control parameters for driving a wafer stage. The wafer sensed by the alignment sensor is exposed under exposure position control based on the calculated control parameters. The exposed wafer is developed in order to form a desired pattern thereon. Subsequently, the overlay offset is measured in order to determine whether or not the positional deviation of the resist pattern from the pattern existing o n the wafer is less than a device design standard. Overlay offsets exceeding the design standard would bring about various defects. Today, the allowable overlay offset is strictly limited to around 0.1 μm, so that highly accurate alignment and highly accurate measurement of offsets are essential. In light of this, the current trend is toward the use of an automatic measuring device having an image processing function. Usually, the automatic measuring device processes an exclusive measurement pattern read out of several points (five to ten points) of the wafer surface.

As for the overlay offset, it has been customary to test all the wafers of a lot (first testing method hereinafter) or to test only sample wafers (second testing method hereinafter), depending on the kind of devices and the step.

Because the first testing method measures all the wafers of a lot in order to determine their overlay offsets, it insures that all the wafers of the lot have overlay offsets lying in an allowable range. However, the problem with the first testing method is that it increases the testing time for a single lot. For example, assume that a single lot has twenty-five wafers, and that each wafer is measured at five spaced points (in X and Y directions at each point). Then, the total measuring time is as long as about 20 minutes to 30 minutes. Such a period of time is about 50% of the total period of time necessary for a demagnification protection aligner to handle the same number of wafers. Therefore, assuming that testing all the wafers is a standard method, then a great number of automatic measuring devices must be used. In addition, an increase in processing time adversely influences the step progress of the lot.

The second testing method measures the overlay offset with, e.g., three sample wafers out of the twenty-five wafers. The three wafers are selected at random. Wether or not the lot is satisfactory is determined on the basis of the overlay offsets of the three wafers. For example, if all the three wafers are satisfactory, the other wafers are also determined to be satisfactory without any measurement, and the entire lot is determined to be satisfactory. If even one of the three wafers is defective, the alignment accuracy of the lot is determined to be ascribable to a low step ability. In this case, the other wafers of the lot are additionally tested, or the entire lot is determined to be defective. The second testing method implements a far higher throughput than the first testing method, but cannot insure that the wafers other than the sample wafers have overlay offsets lying in the allowable range.

As stated above, a first problem with the conventional methods is that the first testing method is low in processing efficiency and increases the processing time because all the wafers of a lot are tested or only sample wafers of a lot are tested at random. This stems from the fact that a system for estimating alignment accuracy lot by lot and selecting an adequate test mode is not available.

A second problem is that in the case of the sampling scheme, the overlay offsets of wafers other than the sample wafers cannot be guaranteed with high accuracy. This is because a system for estimating a distribution of overlay offsets of the entire lot from the measured overlay offsets of sample wafers is not available.

SUMMARY OF THE INVENTION

It is therefore an object of the present invention to provide a method capable of automatically determining, in an overlay offset measuring step, whether or not sampling should be done, and thereby reducing the measuring time and guaranteeing with accuracy the overlay offsets of wafers other than sample wafers when sampling is effected.

In accordance with the present invention, in a method of measuring a positional deviation of a resist pattern formed by aligning a semiconductor wafer and then exposing and developing the wafer from a pattern existing on the wafer, whether or not the positional deviation should be measured by sampling is determined on the basis of wafer-by-wafer measured alignment data.

BRIEF DESCRIPTION OF THE DRAWINGS

The above and other objects, features and advantages of the present invention will become apparent from the following detailed description taken with the accompanying drawings in which:

FIG. 4 is a flowchart demonstrating a system operation controlled by the illustrative embodiment;

FIG. 5 is a flowchart showing a procedure following the procedure shown in FIG. 4.

DESCRIPTION OF THE PREFERRED EMBODIMENT

Figures 1, 1A:
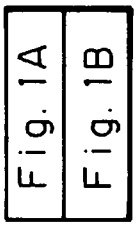
FIG. 1 is a flowchart showing an overlay offset measuring method embodying the present invention.

To better understand the present invention, brief reference will be made to a conventional method of measuring the overlay offset of a resist pattern formed on a wafer. FIG. 1 shows a procedure beginning with projection exposure using a demagnification projection aligner and ending with the measurement of an overlay offset.

In a step S1 shown in FIG. 1, an alignment sensor mounted on the demagnification projection aligner measures several alignment marks (generally five to fifteen points) formed on a wafer beforehand, and repeats this with every wafer, as stated earlier. Then, the coordinates data of the individual mark are statistically processed in order to calculate a position to which a wafer stage should be driven. Control parameters may generally be classified into four orthogonal components, i.e., a scaling value representative of the amount of expansion/contraction of a wafer, a rotation value representative of the amount of rotation of a wafer, an orthogonality value representative of the degree of orthogonality of a wafer, and a shift value representative of the amount of shift of the entire wafer. These values will sometimes be referred to as measured alignment data.

The wafer measured by the alignment sensor is exposed in accordance with exposure position control based on the above measured alignment data. While twenty-five to fifty wafers are usually dealt with as a lot or batch, the demagnification projection aligner exposes the wafers one by one.

Subsequently, in a step S2, the exposed wafer is developed by a developer. As a result, needless portions of the resist are melted, forming a desired pattern on the wafer.

In a step S3 following the step S2, the overlay offsets of the wafers are measured. The number of wafers to be subjected to the overlay offset measurement is determined beforehand on the basis of the kind of devices and the step, as stated previously. Specifically, there are available the previously stated first testing method which tests all the wafers one by one, and the second testing method which tests only sample wafers. Because the first testing method measures all the wafers in order to determine their overlay offsets, it insures that all the wafers of a single lot have overlay offsets lying in an allowable range. However, the first testing method increases the testing time for a single lot. The second testing method implements a far higher throughput than the first testing method, but cannot insure that the wafers other than the sample wafers have overlay offsets lying in an allowable range.

Figure 2B:
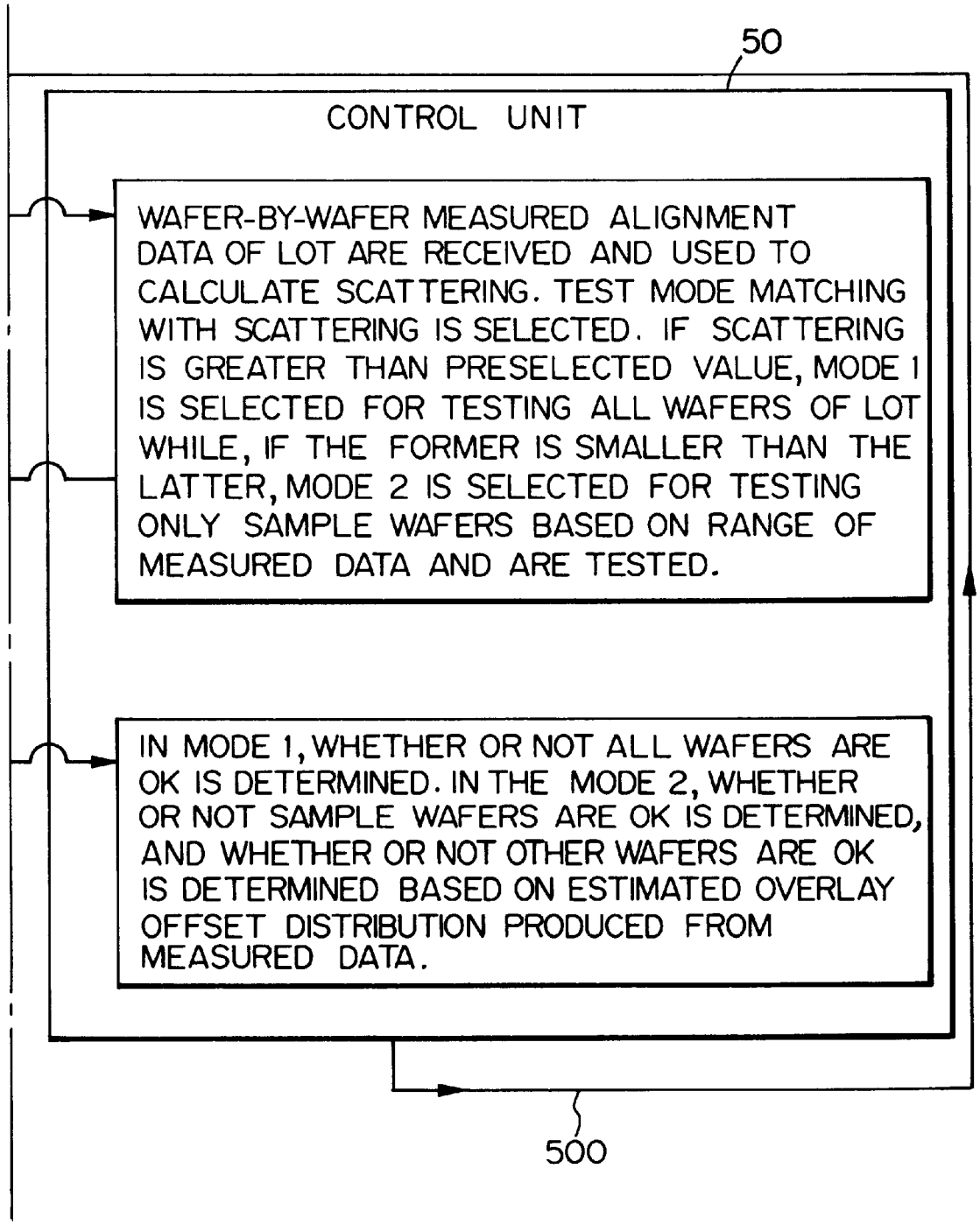
FIG. 2 shows a system configuration for practicing the illustrative embodiment.

Referring to FIG. 2, a system for practicing a measuring method embodying the present invention is shown. The system will also be described in relation to a lithography step using a demagnification projection aligner.

A host computer, or host as referred to hereinafter, 10 controls the processing of a lot. Specifically, the host 10 specifies an order of processing steps and transfers, after a lot of wafers have been set on an apparatus, a process condition program and other necessary information to a demagnification projection aligner 20, a developer 30, and an automatic overlay offset measuring unit 40. These units 20, 30 and 40 each sends to the host 10 information relating to the respective lot processing states, i.e., the beginning and end of processing (100, FIG. 2).

A measurement control unit 50 is linked with the projection aligner 20, automatic measuring unit 40, and host 10. The operation of the control unit 50 will be outlined hereinafter.

The projection aligner 20 sends wafer-by-wafer measured alignment data to the control unit 50 (200, FIG. 2). The control unit 50 calculates a scattering (standard deviation) with each of the scaling value and other preselected values. Then, the control unit 50 determines a relation in size between the standard deviation and a preselected standard value matching with the kind of wafers and the step. The control unit 50 selects, based on the above relation, a particular test mode for measuring overlay offsets, and informs the measuring unit 40 of the test mode before measurement (300, FIG. 2).

Specifically, the control unit 50 selects a test mode 1 if the standard deviation is greater than the preselected value, or selects a test mode 2 if the former is smaller than the latter. In the mode 1, all the wafers of a lot are tested while, in the mode 2, only the sample wafers are tested. Further, in the test mode 2, the wafers to be sampled are determined on the basis of a distribution of the measured alignment data. For example, three wafers shown the greatest value, medium value and smallest value as to the item having the greatest scattering are sampled.

Modern lot control manages the slot numbers of a carrier each storing a particular wafer by using data, so that the measured alignment data can be extracted in correspondence to the slot number. In addition, the wafers to be measured can be designated in terms of the slot number.

The overlay offsets measured by the measuring unit 40 are sent to the control unit 50 (400, FIG. 2). In the test mode 1, the control unit 50 determines whether or not the overlay offset of the individual wafer lies in the allowable range assigned to its kind and the step, and transfers the resulting data to the host 10 (500, FIG. 2). In the test mode 2, the control unit 50 statistically processes the overlay offsets of the sample wafers and thereby estimates a width of distribution of the offsets in the lot. Then, the control unit 50 determines whether or not the offsets of the sample wafers lie in the allowable range and whether or not the estimated distribution is smaller in width than a standard distribution. If the results of such two decisions both are positive, the control unit 50 determines that the other wafers of the lot are also satisfactory, and then sends to the host 10 data showing that all the wafers of the lot are satisfactory (500, FIG. 2).

In the mode 2, if the offsets of all the sample wafers do not lie in the allowable range, the control unit 50 determines that all the wafers in the lot are defective. If only the width of the estimated distribution is greater than the width of the standard distribution, the control unit 50 commands the measuring unit 40 to additionally measure the offsets of the wafers other than the sample wafers.

The standard deviation of the measured data and the estimated width of the deviation derived from the measurement of the overlay offsets of wafers, which are to be dealt with by the control unit 50, will be described more specifically.

Figure 3B:
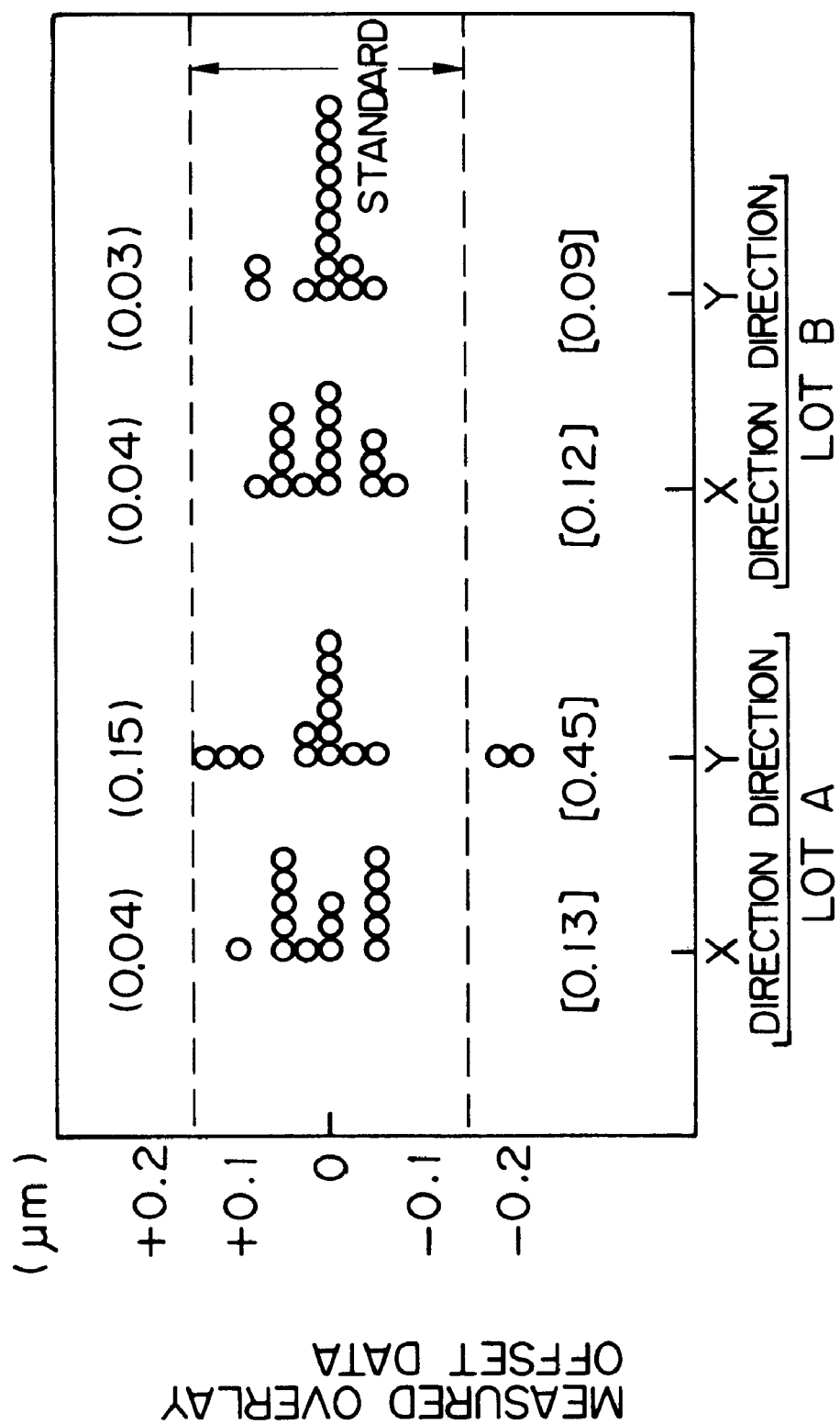
FIGS. 3A and B plot actual data for describing statistic values which a control unit included in the system of FIG. 2 uses.

FIG. 3A shows specific distributions of measured alignment data actually derived from lots A and B of wafers in the same step. FIG. 3B shows specific distributions of the measured overlay offsets also derived from the lots A and B.

FIG. 3A shows a relation between measured scaling data (expansion/contraction ratio) scattered more than the other measured alignment data and the measured overlay offset.

Specifically, FIG. 3A shows the distribution of scaling values measured with five wafers of each lot in X and Y directions. Parenthesized numerical values are representative of standard deviations $\sigma_{n-1}$. In FIG. 3, the measured values of the lot A in the Y direction are more than twice as great as the other measured values. Therefore, paying attention to the scaling Y direction, three wafers respectively having the greatest value U, medium value M and smallest value L as to the measured scaling value distribution were selected, and the offset of the individual wafer was measured at five points in the wafer. FIG. 3B shows the results of the measurement.

As FIG. 3B also indicates, the offsets of the lot A in the Y direction is great; wafers not lying in the standard range of ±0.15 exist. Actually, the wafers showed the greatest value U and smallest value L as shown in FIG. 3A were defective. This suggests that an increase in the scattering of the measured alignment data tends to increase the distribution of the actual offsets. Moreover, assume that the wafers are sampled at random, as in the conventional scheme. Then, if only the wafers of the lot A showing data around the medium value M are tested, even the defective wafers of the lot A will be determined to be satisfactory.

As to the width of distribution of overlay offsets, a value produced by adding $3\sigma_{n-1}$ to the absolute value of a mean value is expected to be a standard maximum value at one side of the distribution, as customary with statistics. The illustrative embodiment also uses the result of "|mean value|+$3\sigma_{n-1}$" as the estimated width of overlay offset distribution.

In FIG. 3B, bracketed numerical values indicate the estimated widths of overlay offset distributions. As shown, the Y direction of the lot A has the greatest estimated width while the other widths are smaller than 0.15 μm which is the width of one side of the actual standard value. It will therefore be seen that the estimated width is usable as an index for estimating the step ability of the overlay offsets of a lot.

As stated above, selecting a particular measurement mode on the basis of the scattering of measured alignment values is extremely rational. Further, it may safely be said that if only those of the sampled wafers showed the greatest value, medium value and smallest value are tested, and if the statistic values of the distributions of the measured values are used to determine whether or not the lot is satisfactory, there can be noticeably improved the guaranteeing accuracy of the overlay offsets of the entire lot.

Figure 6B:
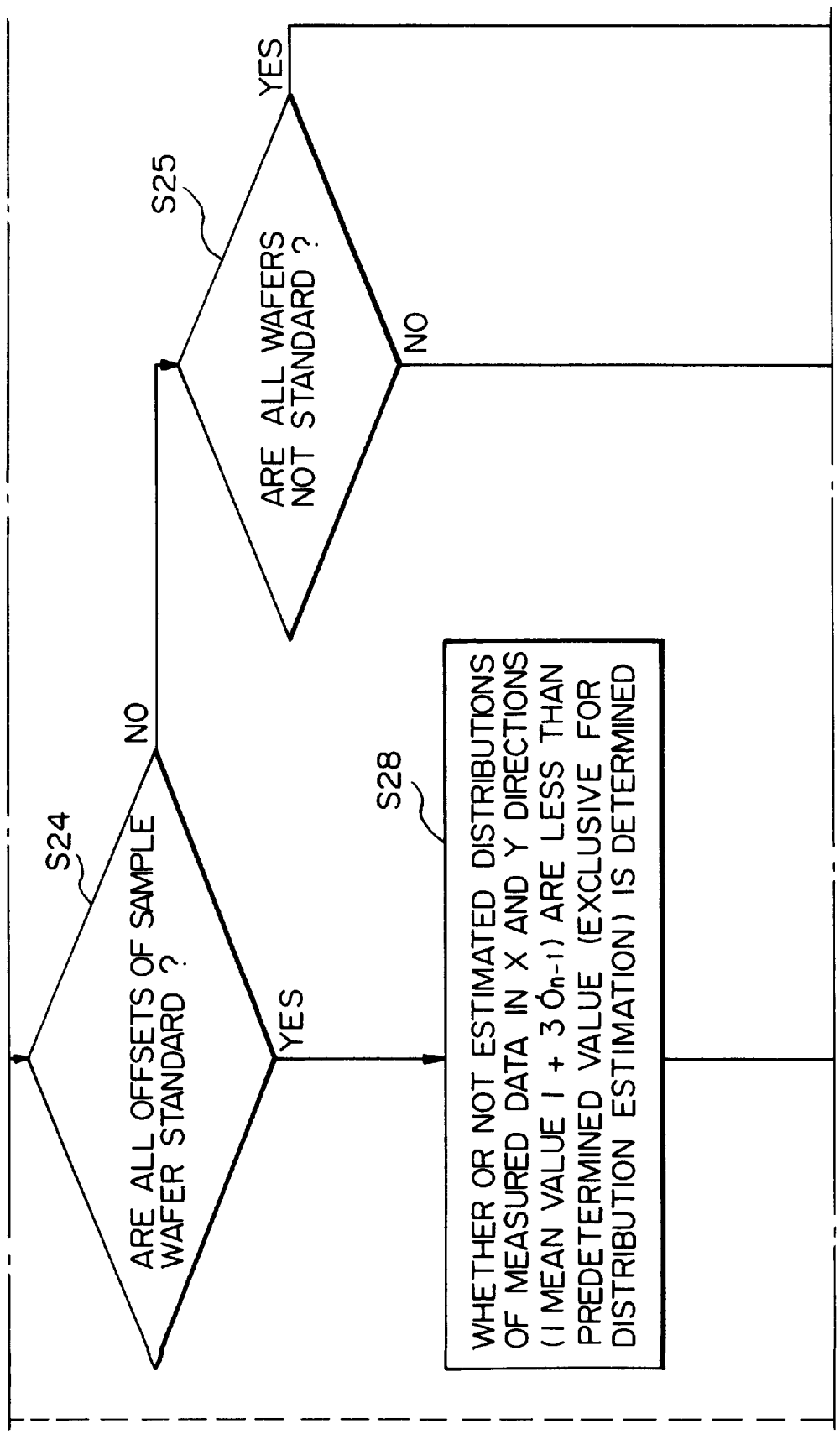
FIG. 6 is a flowchart showing a procedure following the procedure shown in FIG. 5.
Figure 6C:
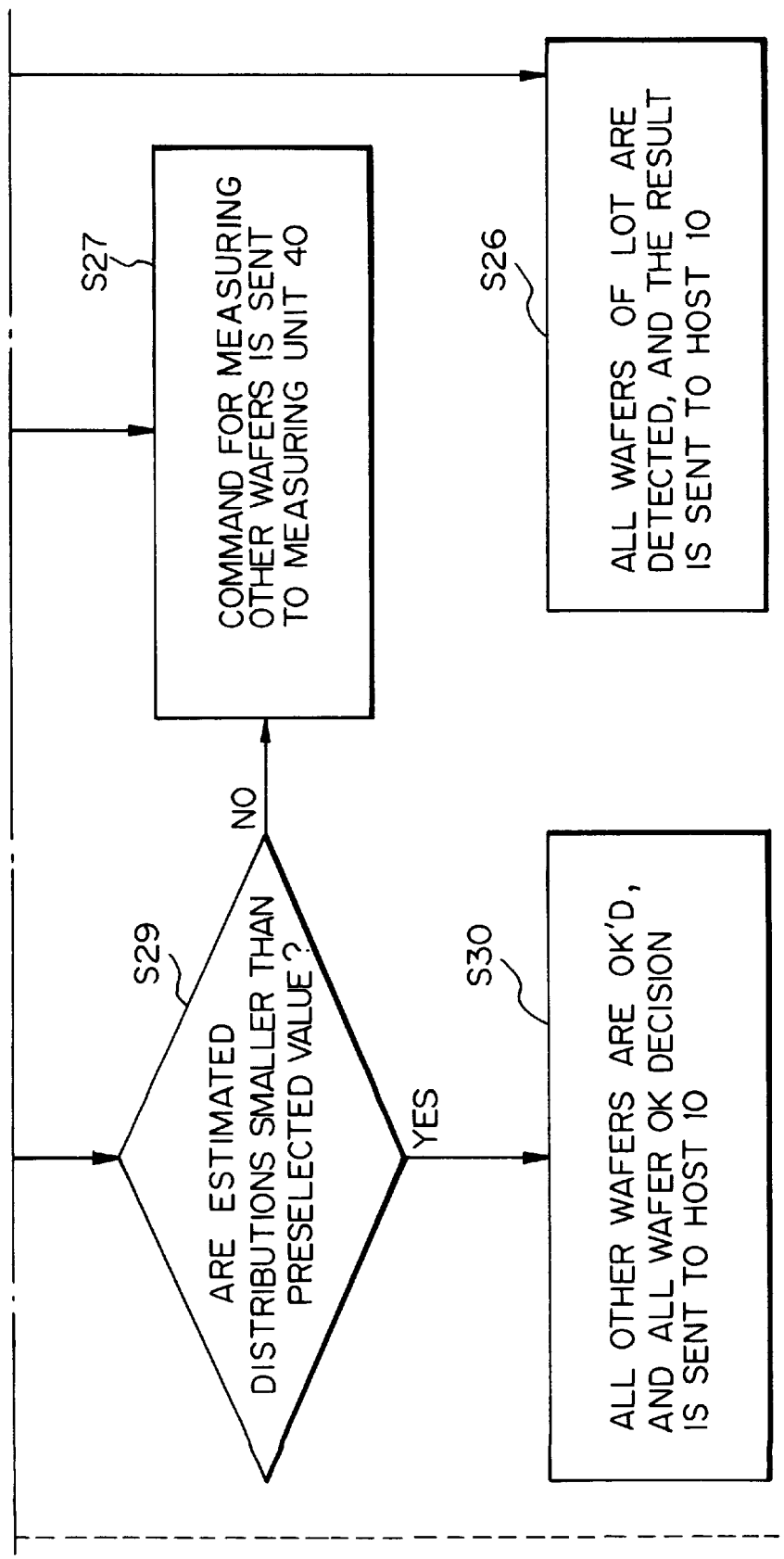

Reference will be made to FIGS. 4–6 for describing the illustrative embodiment more specifically. The measured alignment data of every wafer are sent from the projection aligner 20 to the control unit 50 together with the slot number of a wafer carrier assigned to the wafer (step S11). On receiving the data (step S12), the control unit 50 calculates the standard deviation of the individual item of measurement (step S13). The control unit 50 compares the standard deviation with a standard value set beforehand on the basis of the kind of wafers, the step, and the item (step S14). Then, the control unit 50 selects either the test mode 1 or the test mode 2 on the basis of the relation in size between the above two values.

If the standard deviation is greater than the standard value (NO, step S15), the control unit 50 commands the measuring unit 40 to perform the test mode 1, i.e., to test all the wafers of the lot (step S16). If the standard deviation is smaller than the standard value (YES, step S15), the control unit 50 commands the measuring unit 40 to perform the test mode 2 (step S17) while designating the wafers to be sampled. To select the wafers to be sampled, the control unit 50 uses, e.g., a value produced by dividing the standard deviation of the result of alignment measurement by a constant preselected on an item basis. The constant is used to convert a unit item by item and to weight the standard deviation in accordance with, e.g., the item-by-item degree of influence on the overlay offset. Subsequently, the control unit 50 determines the item having the greatest value produced by the above calculation, and then selects wafers showing the greatest, medium and smallest values as to such an item.

On receiving the test mode (step S18), the measuring unit 40 tests the wafers in the designated test mode (step S19). In the test mode 2, the measuring unit 40 automatically picks up the wafers designated by the control unit 50. After the measurement, the measuring unit 40 sends wafer-by-wafer measurement data to the control unit 50 (step S20).

In the test mode 1, the control unit 50 determines whether or not the overlay offset lies in the allowable range with every wafer of the lot (step S21), and informs the host 10 of whether or not the offset is acceptable wafer by wafer (step S22). In response, the host 10 selects the flow of the next step for the above lot. In the mode 2, the control unit 50 determines whether or not all the overlay offsets of all the sampled wafers (three in the embodiment) lie in the preselected range (step S23).

If all the wafers are out of standard (NO, step S24 and YES, step S25), the control unit 50 determines that all the wafers of the lot are defective. This is because when the wafers showed the upper limit and lower limit of the allowable range both are defective, it is quite likely that all the wafers of the lot are defective. If some (one or two) of the wafers is satisfactory, but the other wafers are defective, the control unit 50 commands the measuring unit 40 to additionally test the other wafers of the same lot (step S27). This allows defective wafers to be picked up from the other wafers.

If all the measured wafers are satisfactory (YES, step S24), the control unit 50 produces the previously stated estimated width of distribution and determines whether or not it is smaller than the preselected standard value (step S28). If the estimated value is greater than the standard value (NO, step S29), the control unit 50 determines that the overlay offsets of the lot are derived from a low step ability, and causes the measuring unit 40 to perform measurement with the other wafers of the lot. If the estimated value is smaller than the standard value (YES, step S29), the control unit 50 determines that the overlay offsets of the lot are derived from a high step ability, and that all the wafers other than the sampled wafers are also satisfactory (step S30). Then, the control unit 50 informs the host 10 of the fact that all the wafers of the lot are satisfactory.

In summary, in accordance with the present invention, an overlay offset measuring method is capable of selecting an adequate measurement mode lot by lot, i.e., testing only the sample wafers of a lot if the lot has sufficient alignment accuracy or testing all the wafers of the lot if the alignment accuracy is not sufficient. This is practicable with a system capable of statistically processing measured alignment data of an aligner, and selecting a particular measurement mode matching with the result of the processing.

Further, by testing only the sample wafers of a lot, the method of the present invention can make sure decision while guaranteeing the overlay offsets of the wafers other than the sample wafers. This is because the method picks up the sample wafers on the basis of the measured alignment data, calculates an estimated width of distribution of overlay offsets in the lot on the basis of the overlay offsets of the sample wafers, and then determines whether or not the slot is satisfactory.

Various modifications will become possible for those skilled in the art after receiving the teachings of the present disclosure without departing from the scope thereof.

What is claimed is:

1. In a method of measuring a positional deviation of a resist pattern formed on a semiconductor wafer belonging to a lot of semiconductor wafers, said method comprising the steps of:

obtaining measured alignment data of the semiconductor wafers in the lot;

calculating an amount of scatter of preselected data included in the measured alignment data;

exposing and developing the resist pattern on said semiconductor wafer from a pattern existing on said semiconductor wafer; and determining whether or not the positional deviation of the resist pattern should be measured by sampling in accordance with the amount of scatter.

2. A method as claimed in claim 1, wherein when the sampling if effected, calculating an estimated width of a distribution of positional deviations from measured positional deviations of sample semiconductor wafers, and then determining whether or not positional deviation measurement should also be performed for wafers other than said sample semiconductor wafers.

3. A method as claimed in claim 1, wherein semiconductor wafers to be sampled are selected on a basis of a distribution of the measured alignment data.

4. A method as claimed in claim 3, wherein when the sampling if effected, calculating an estimated width of a distribution of positional deviations from measured positional deviations of sample semiconductor wafers, and then determining whether or not positional deviation measurement should also be performed for wafers other than said sample semiconductor wafers.

5. A method as claimed in claim 1, wherein a standard deviation of a scaling value is calculated as the amount of scatter.

6. A method as claimed in claim 5, wherein the positional deviation of the resist pattern is measured by sampling if the standard deviation of the scaling value is less than a preselected standard deviation.

7. A method as claimed in claim 5, wherein the positional deviation of the resist pattern of every semicondutor wafer in the lot is measured if the standard deviation of the scaling value is greater than a preselected standard deviation.

* * * * *